United States Patent [19]
Landry et al.

[11] Patent Number: 5,493,241
[45] Date of Patent: Feb. 20, 1996

[54] MEMORY HAVING A DECODER WITH IMPROVED ADDRESS HOLD TIME

[75] Inventors: Gregory J. Landry; Cathal G. Phelan, both of Santa Clara, Calif.

[73] Assignee: Cypress Semiconductor, Inc., San Jose, Calif.

[21] Appl. No.: 340,252

[22] Filed: Nov. 16, 1994

[51] Int. Cl.$^6$ .............................. G11C 8/00; H03K 19/20
[52] U.S. Cl. .......................... 326/105; 326/96; 365/194; 365/230.06; 365/230.02
[58] Field of Search .................... 326/96, 105; 327/278, 327/276; 365/230.06, 194, 230.02

[56] References Cited

U.S. PATENT DOCUMENTS

| | | | |
|---|---|---|---|
| 4,644,189 | 2/1987 | Gabillard | 365/200 |
| 4,737,670 | 4/1988 | Chan | 327/278 |
| 4,803,665 | 2/1989 | Kasa | 365/194 |
| 4,807,191 | 2/1989 | Flannagan | 365/189 |
| 4,849,937 | 7/1989 | Yoshimoto | 365/194 |
| 5,062,082 | 10/1991 | Choi | 365/230 |
| 5,083,294 | 1/1992 | Okajima | 365/200 |
| 5,214,606 | 5/1993 | Hashimoto | 365/218 |
| 5,233,559 | 8/1993 | Brennan, Jr. | 365/200 |
| 5,267,205 | 11/1993 | Hamada | 365/200 |
| 5,357,479 | 10/1994 | Matsui | 365/230 |
| 5,391,941 | 2/1995 | Landry | 326/105 |

OTHER PUBLICATIONS

B. F. Fitzgerald et al., "Memory System with High–Performance Word Redundancy," IBM Technical Disclosure Bulletin, vol. 19, No. 5, pp. 1638–1639 (Oct. 1976).

*Primary Examiner*—Edward P. Westin
*Assistant Examiner*—Richard Roseen
*Attorney, Agent, or Firm*—Blakely, Sokoloff, Taylor & Zafman

[57] ABSTRACT

A memory includes a memory array and a decoder. The memory array includes a plurality of memory locations and the decoder is coupled to receive an address for decoding the address to generate a select signal for selecting one of the plurality of memory locations in the memory array for a memory operation. The memory further includes circuitry coupled to the decoder for delaying the select signal for a first predetermined delay time to generate a delayed select signal and for selectively applying one of the select signal and the delayed select signal to the memory array. The circuitry applies the delayed select signal to the memory array during the memory operation before the select signal is to be deasserted such that address hold time of the memory operation is decreased without affecting the memory operation. The circuitry includes a delay circuit for delaying the select signal, a select circuit for selecting one of the select signal and the delayed select signal to be applied to the memory array, and a resettable delay circuit for delaying a memory operation control signal for a second predetermined delay time to select one of the select signal and the delayed select signal.

16 Claims, 10 Drawing Sheets

MEMORY HAVING A DECODER WITH IMPROVED ADDRESS HOLD TIME

FIELD OF THE INVENTION

The present invention pertains to the field of integrated circuits. More particularly, this invention relates to a decoder for a memory that allows improved address hold time during a memory operation without affecting the start of the memory operation and other memory operations.

BACKGROUND OF THE INVENTION

Figure 1:
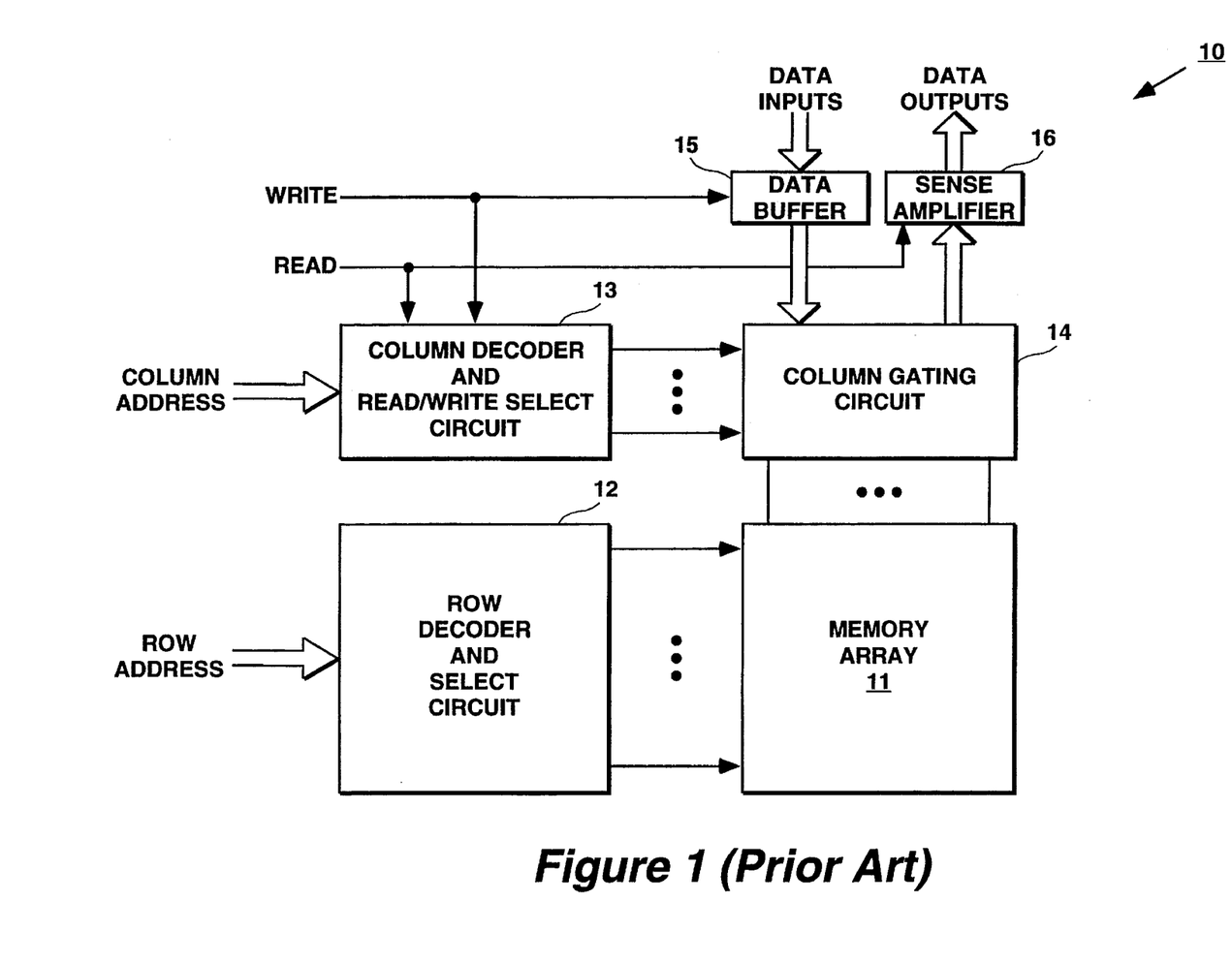
FIG. 1 is a block diagram of a memory that includes a prior art decoder and read/write select circuit.

One type of prior art volatile memory is the random access memory ("RAM"). A RAM typically includes a memory array for storing data. Data can be written into and then read from the memory array at addresses. No prior erasure is required to write new data into the memory array. FIG. 1 shows the structure of a prior art RAM 10.

Figure 2:
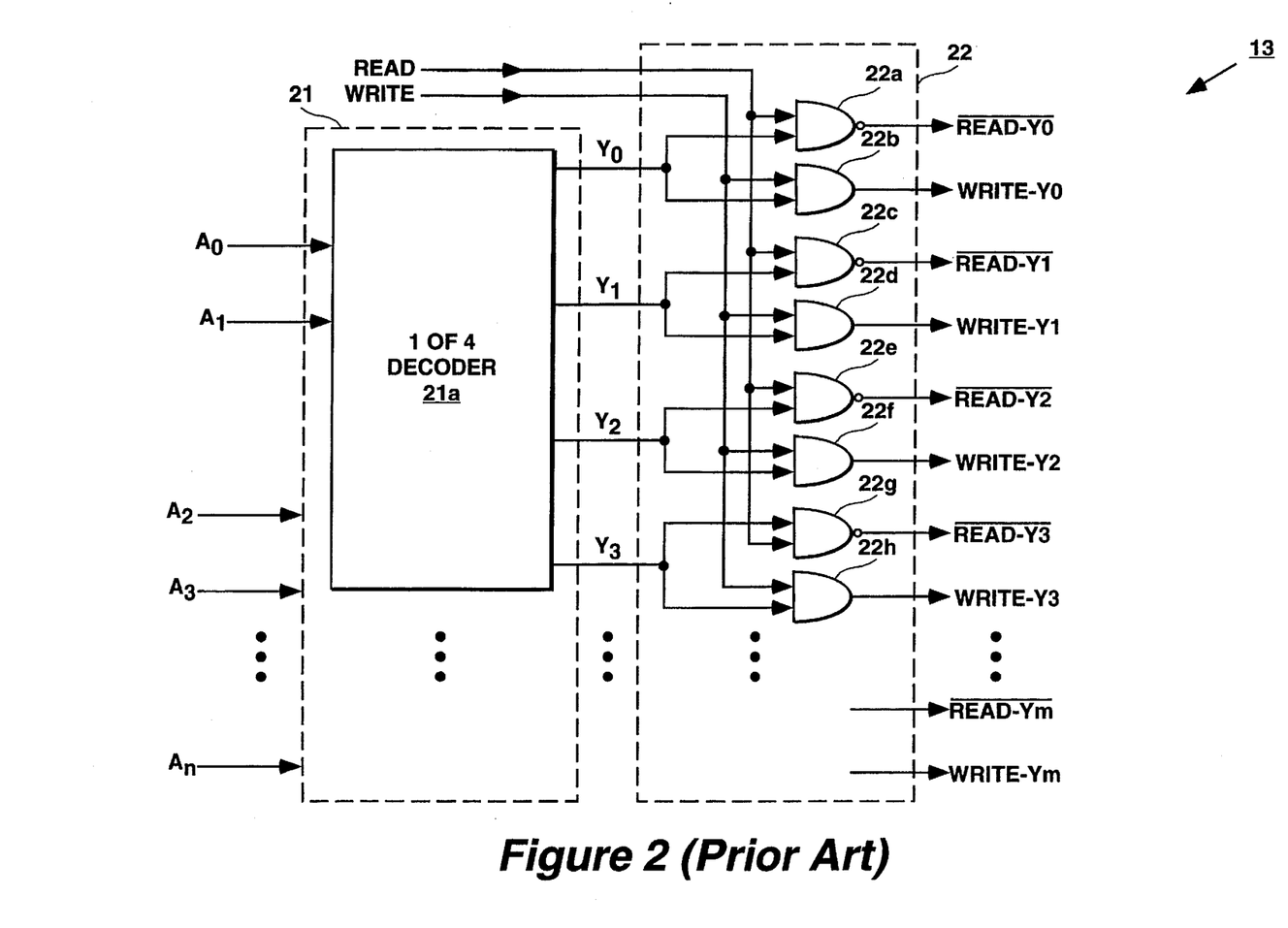
FIG. 2 is a block diagram of the prior art decoder and read/write select circuit of the memory of FIG. 1.
Figure 3:
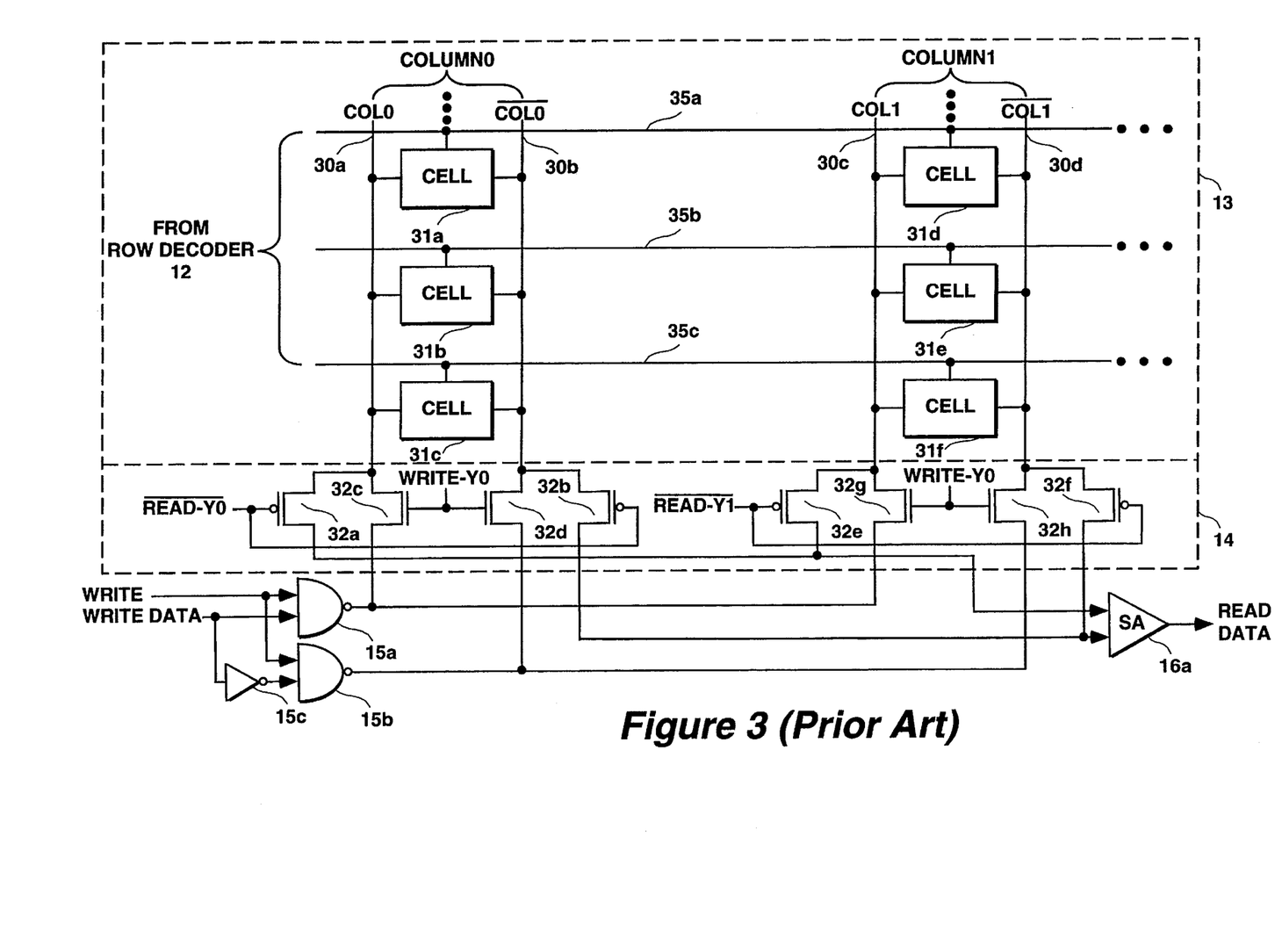
FIG. 3 schematically shows the memory array and column gating circuit of the memory of FIG. 1.

As can be seen from FIG. 1, a column decoder and read/write select circuit 13 is connected to a memory array 11 via a column gating circuit 14. Circuit 13 selects a number of columns in memory array 11 via column gating circuit 14 for a memory read or write operation for each address received. A row decoder and select circuit 12 selects a row in memory array 11. Memory cells at intersections of the selected columns and row are selected cells. Circuit 13 also receives a read enable signal READ and a write enable WRITE signal. The READ signal causes the selected cells to undergo the read operation and the WRITE signal causes the selected cells to undergo the write operation. Data stored in the selected cells are sensed by a sense amplifier 16 during the read operation. Data to be written into the selected cells are applied from a data buffer 15 during the write operation. FIG. 2 shows the circuitry of column decoder and read/write select circuit 13 that includes a column decoder 21 and a read/write select circuit 22. FIG. 3 shows the array configuration of memory array 11 and column gating circuit 14.

As can be seen from FIGS. 2 and 3, during a write operation, the WRITE signal is asserted and the READ signal is deasserted. This causes all the read select outputs of circuit 22 not to be asserted. If a decoder 21a of column decoder 21 decodes a portion of a column address to select column COLUMN0 of memory array 11 by asserting a Y0 select signal, the Y0 select signal then passes through an AND gate 22b of circuit 22 to become a WRITE-Y0 signal. The WRITE-Y0 signal then causes gating transistor 32c to connect column line 30a to a NAND gate 15a and gating transistor 32d to connect column line 30b to a NAND gate 15b. Column lines 30a and 30b are a pair of complementary column lines for column COLUMN0. Depending on the data to be written, either line 30a or line 30b is brought to logical low state. NAND gates 15a and 15b apply the write data under the control of the WRITE signal. NAND gates 15a and 15b and inverter 15c are part of data buffer 15 of FIG. 1.

When the READ signal is asserted while the WRITE signal is deasserted, memory 50 then undergoes the read operation, the Y0 select signal then passes through a NAND gate 22a of circuit 22 to become a $\overline{\text{READ-Y0}}$ select signal. The $\overline{\text{READ-Y0}}$ select signal then causes gating transistors 32a and 32b of column gating circuit 14 to connect column lines 30a and 30b to sense amplifier 16a. Sense amplifier 16a then senses the data stored in the selected memory cell along column COLUMN0. Sense amplifier 16a is part of sense amplifier 16.

Figure 4:
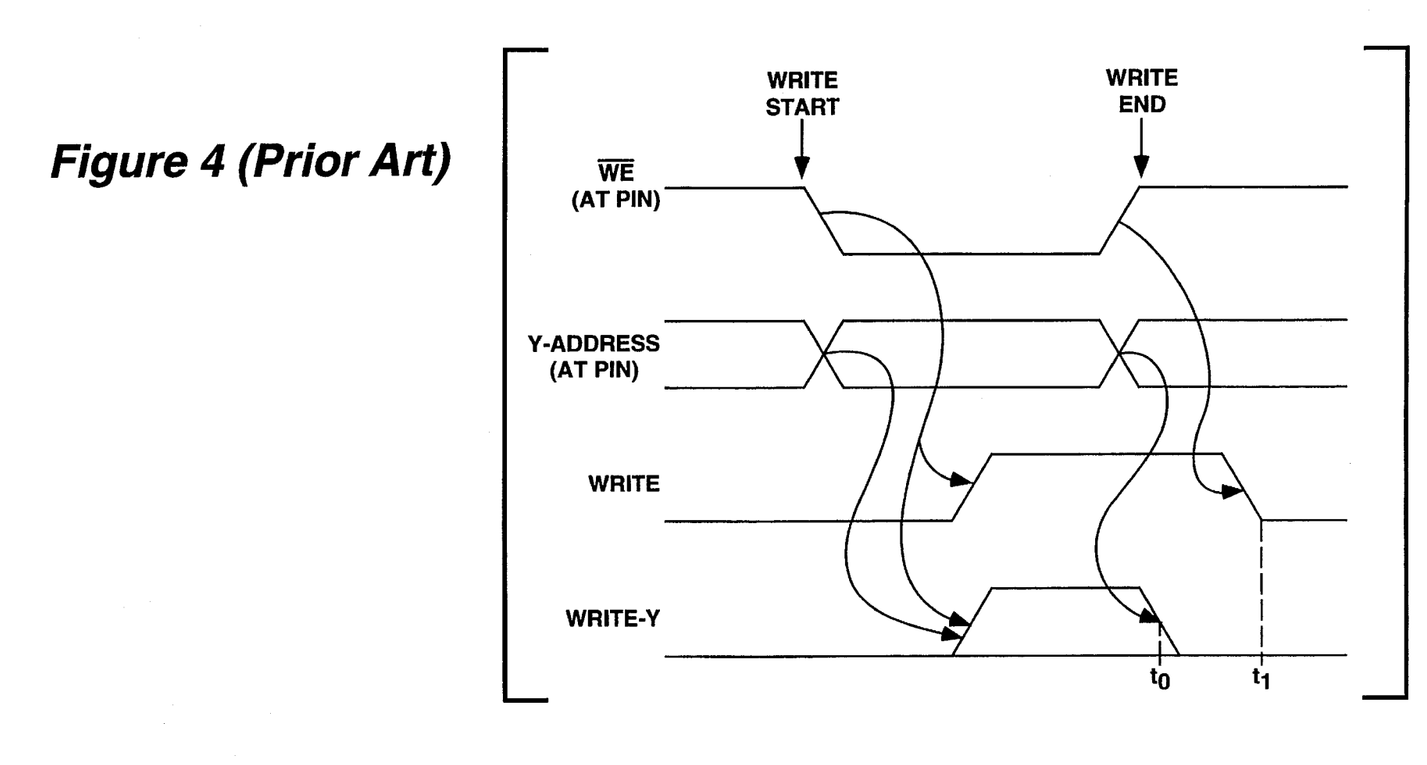
FIG. 4 shows various signal waveforms with respect to the prior art decoder and read/write select circuit of FIG. 2.

Disadvantages are, however, associated with this prior art memory shown in FIGS. 1 through 3. One disadvantage is that a memory cell may be accidentally written with a data bit left along a column of the memory from a prior write operation due to insufficient data recovery in the memory. As is known, in order to allow a memory to operate fast, each of the read and write operations of the memory needs to be switched off and the address of the operation needs to cease to be applied to the memory as soon as the operation ends such that another operation can immediately follow. However, if the address of a write operation stops being applied to the memory too quickly during the operation, the respective gating transistors of column gating circuit 14 may be switched off well before the write operation ends. This may allow insufficient time for the selected columns of the memory to recover the data and the data may still remain in the selected columns. When another memory read or write operation follows, the data remaining in the selected columns of the previous write operation may be accidentally written into memory cells located at the intersection of the selected columns of the previous write operation and the selected row of the current memory operation. For example, if a prior write operation is to write data into memory cell 31b, the WRITE-Y0 signal causes gating transistors 32c and 32d to conduct and the WRITE signal causes the write data to pass through NAND gates 15a and 15b, respectively, to be applied to the respective one of column lines 30a and 30b. Row decoder 12 (FIG. 1) then selects word line 35b. This causes the data applied at column lines 30a and 30b to be written into memory cell 31b. At the end of the write operation, the WRITE-Y0 signal is deasserted as soon as the address ceases to be applied to column decoder 21. This turns off gating transistors 32c and 32d, as seen in FIG. 4. As can be seen from FIG. 4, the WRITE signal is deasserted at timing $t_1$. However, the WRITE-Y signal is deasserted at timing $t_0$. The WRITE-Y signal of FIG. 4 represents any of the write column select signals WRITE-Y0 through WRITE-Ym from circuit 22. This causes the data recovery process of column lines 30a and 30b to be terminated before the write operation is terminated, which causes the data to remain in lines 30a and 30b at the end of the write operation. If, for example, a read operation to memory cell 31d immediately follows the write operation, the data remaining in column lines 30a and 30b may be accidentally written into memory cell 31a when row decoder 12 selects word line 35a to read memory cell 31d along column lines 30c and 30d.

SUMMARY AND OBJECTS OF THE INVENTION

One of the objects of the present invention is to decrease the required address hold time of a memory operation of a memory.

A further object of the present invention is to provide circuitry for a decoder for extending a memory write cycle without affecting the start of the memory write cycle such that data to be written into the addressed memory location are not delayed by the circuitry and without affecting another memory operation that follows.

A memory includes a memory array and a decoder. The memory array includes a plurality of memory locations and the decoder is coupled to receive an address for decoding the address to generate a select signal for selecting one of the plurality of memory locations in the memory array for a memory operation. The memory further includes circuitry coupled to the decoder and the memory array for delaying the select signal for a first predetermined delay time to generate a delayed select signal and for selectively applying one of the select signal and the delayed select signal to the memory array. The circuitry applies the delayed select signal to the memory array during the memory operation before the select signal is to be deasserted such that the select signal is extended without (1) delaying the start of the memory operation, (2) extending the address hold time of the address, and (3) affecting other memory operations. The circuitry includes a delay circuit for delaying the select signal, a select circuit for selecting one of the select signal and the delayed select signal to be applied to the memory array, and a resettable delay circuit for delaying a memory operation control signal for a second predetermined delay time to select one of the select signal and the delayed select signal.

A decoding circuit includes a decoder coupled to receive an address for decoding the address to generate a select signal for selecting a memory location in a memory array for a memory operation, and circuitry coupled to the decoder for delaying the select signal for a first predetermined delay time to generate a delayed select signal and for selectively applying one of the select signal and the delayed select signal to the memory array. The circuitry applies the delayed select signal to the memory array during the memory operation before the select signal is to be deasserted such that the select signal is extended without (1) delaying the start of the memory operation, (2) extending the address hold time of the address, and (3) affecting other memory operations.

Other objects, features, and advantages of the present invention will be apparent from the accompanying drawings and from the detailed description that follows below.

BRIEF DESCRIPTION OF THEE DRAWINGS

The present invention is illustrated by way of example and not limitation in the figures of the accompanying drawings, in which like references indicate similar elements and in which.

DETAILED DESCRIPTION

Figure 5:
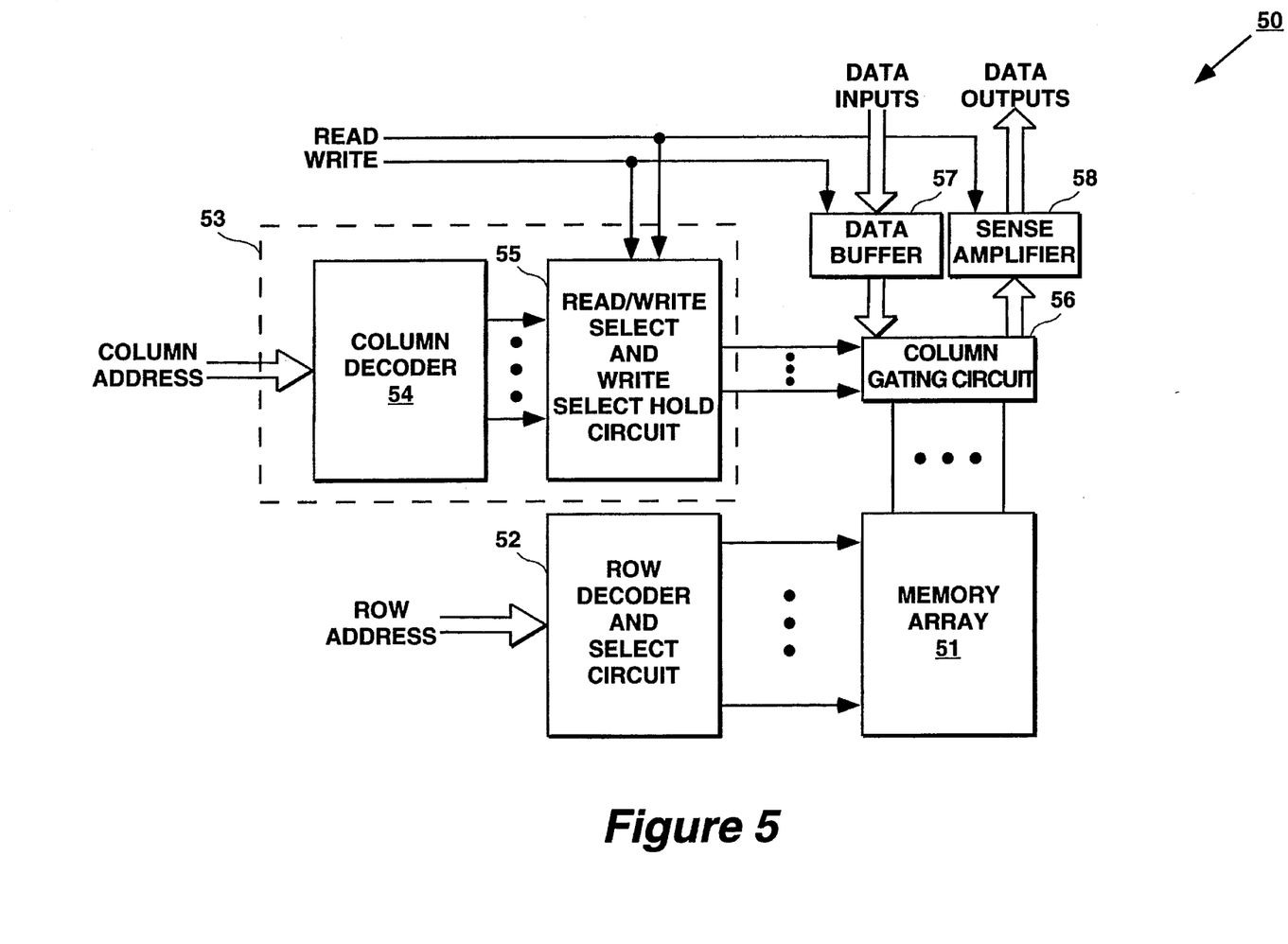
FIG. 5 is a block diagram of a memory that includes a decoding circuit in accordance with one embodiment of the present invention.

FIG. 5 shows in block diagram form the circuitry of a memory 50 that includes a read/write select and write select hold circuit 55 that implements an embodiment of the present invention.

In one embodiment, memory 50 is a volatile memory. In a further embodiment, memory 50 is a RAM. Moreover, memory 50 can be any other type of memory. In one embodiment, all the circuits of memory 50 reside on a single silicon substrate.

As can be seen from FIG. 5, memory 50 includes a memory array 51 that is made up of memory cells (not shown) that store data at addresses. Memory array 51 is organized into rows and columns. The memory cells are arranged at intersections of the rows and columns.

Memory 50 further includes a row decoder and select circuit 52. Row decoder and select circuit 52 is connected to the rows of memory array 51. Row decoder and select circuit 52 selects one row of memory cells for a memory operation for every row address received.

The columns of memory array 51 are connected to a column decoding circuit 53 via a column gating circuit 56. Column decoding circuit 53 selects a number of columns of memory array 51 via column gating circuit 56 for every column address received. The selected columns are connected, via circuit 56, to data buffer 57 or sense amplifier 58. If memory 50 is undergoing a write operation, the selected columns of memory array 51 are then connected to data buffer 57. If memory 50 is undergoing a read operation, the selected columns of memory array 51 are then connected to sense amplifier 58. Column gating circuit 56 includes a read gating transistor and a write gating transistor (all are not shown) for each of the columns of memory array 51. The read gating transistor is used for connecting the respective column to sense amplifier 58 and the write gating transistor is used for connecting the respective column to data buffer 57. When memory 50 undergoes the read operation, column decoding circuit 53 turns on the read gating transistors of circuit 56 that are connected to the selected columns. When memory 50 undergoes the write operation, column decoding circuit 53 turns on the write gating transistors of circuit 56 that are connected to the selected columns.

For one embodiment, column decoding circuit 53 selects one byte of (i.e., eight) columns for every column address received. For another embodiment, column decoding circuit 53 selects one word of (i.e., sixteen) columns for every column address received.

Figure 6:
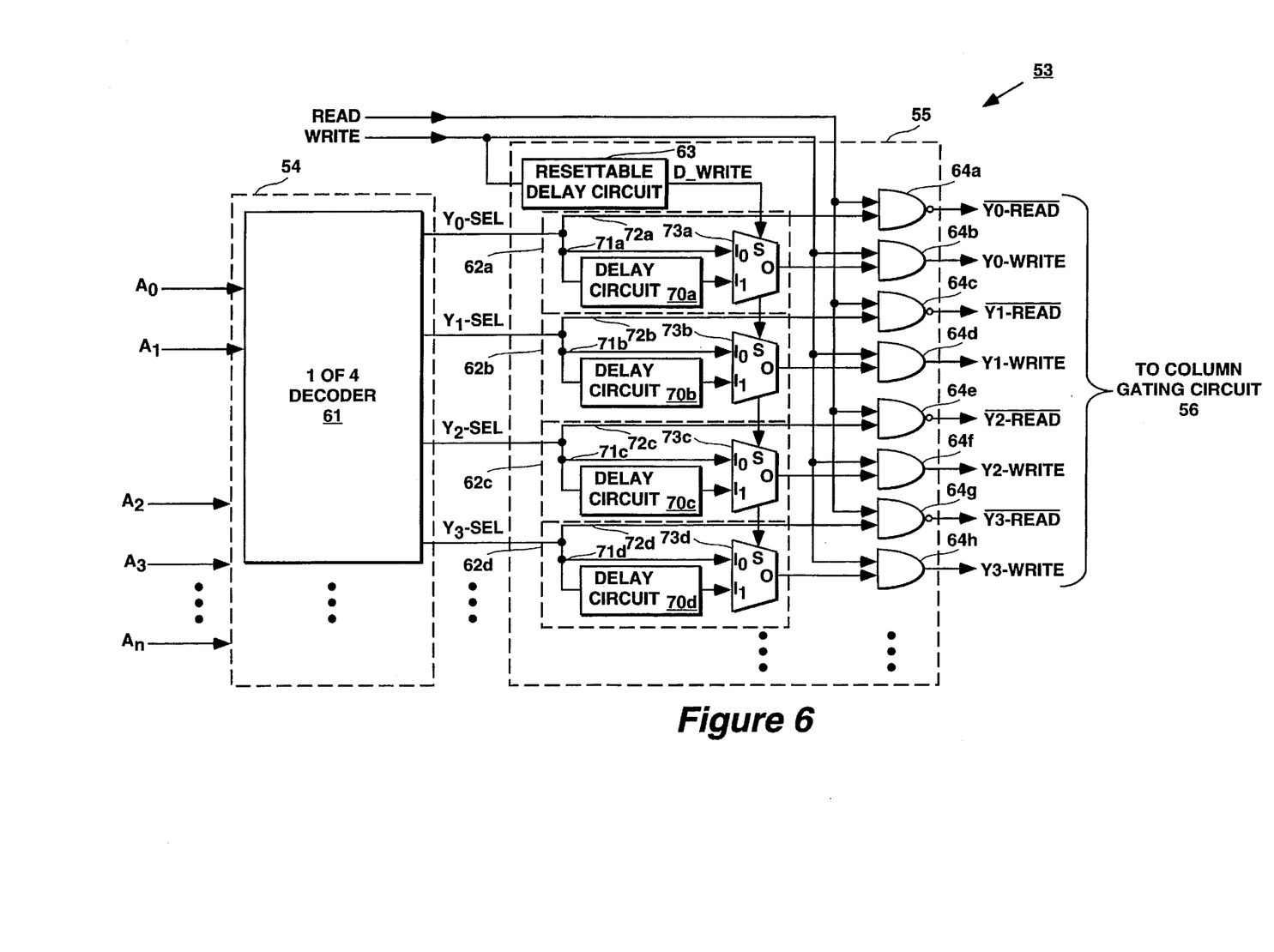
FIG. 6 is a block diagram of the decoding circuit of FIG. 5, wherein the decoding circuit includes a decoder and a read/write select and write select hold circuit.
Figure 7:
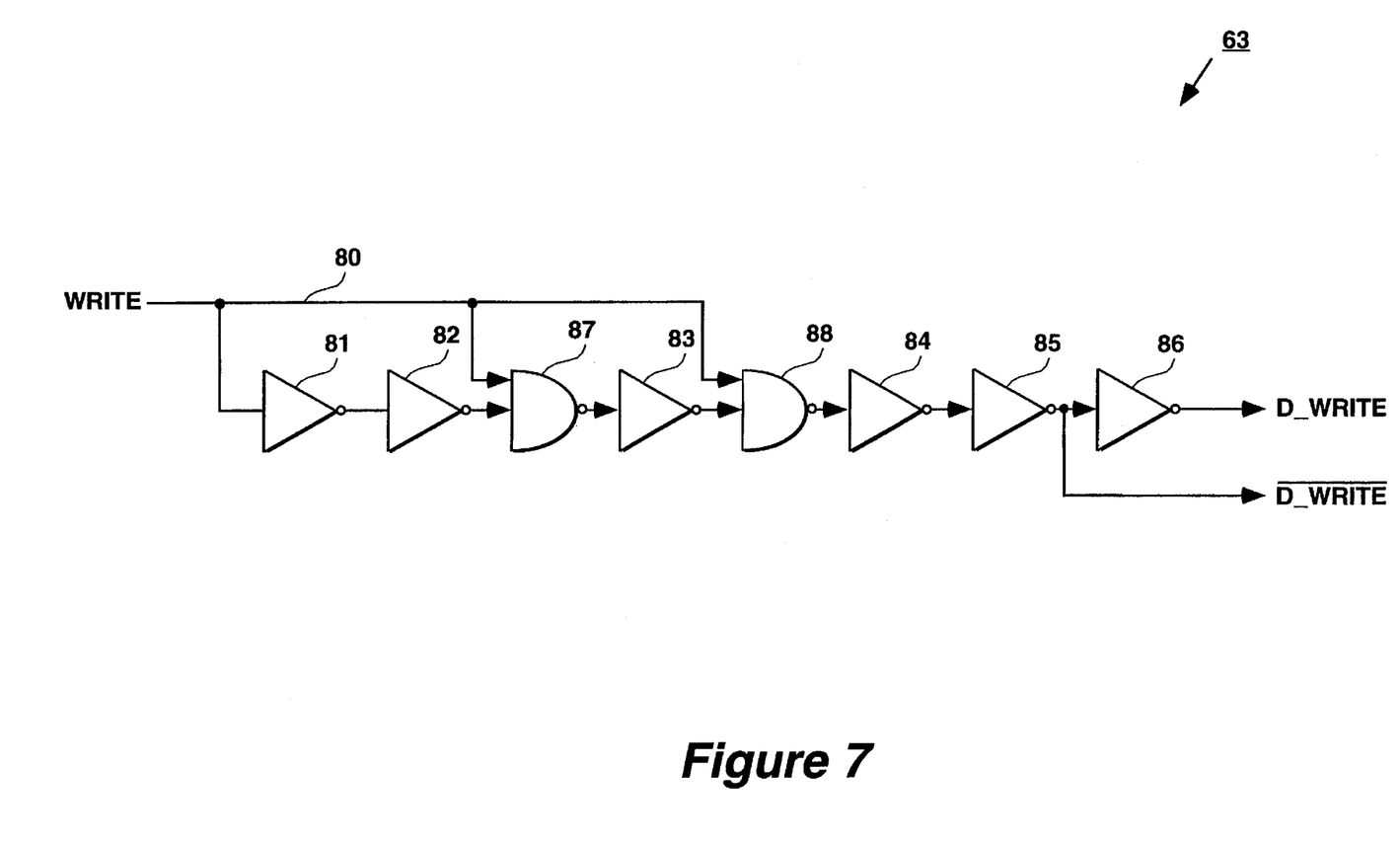
FIG. 7 shows circuitry of a resettable delay circuit of the read/write select and write select hold circuit of FIG. 6.
Figure 8:
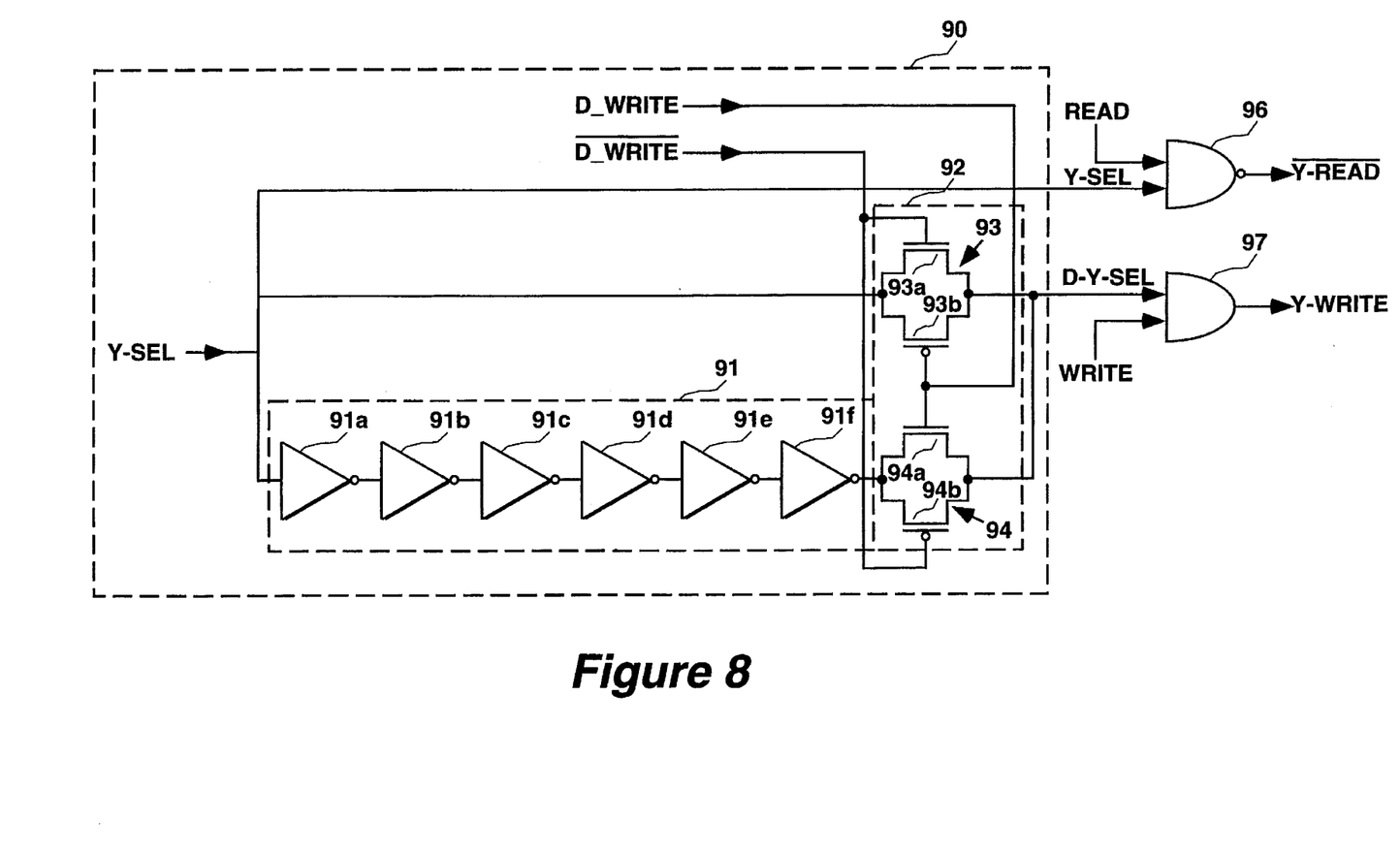
FIG. 8 shows one read and write select path of the read/write select and write select hold circuit of FIG. 6.

Column decoding circuit 53 includes a column decoder 54 and read/write select and write select hold circuit 55. Circuit 55 is connected between column decoder 54 and column gating circuit 56. FIGS. 6 through 8 illustrate the circuits of column decoder 54 and read/write select and write select hold circuit 55, which will be described in more detail below.

Column decoder 54 receives a column address to generate a number of column select signals to circuit 55. The column select signals are used to select the selected columns of memory array 51 that correspond to the column address. Circuit 55 determines whether the column select signals are used to turn on the read gating transistors or the write gating transistors of column gating circuit 56 that are connected to the selected columns of memory array 51.

Read/write select and write select hold circuit 55 receives a READ signal and a WRITE signal. The READ and WRITE signals are two memory operation control signals. When the READ signal is asserted, memory 50 undergoes the read operation and circuit 55 causes the column select signals to turn on the read gating transistors of column gating circuit 56 that are connected to the selected columns of memory array 51. When the WRITE signal is asserted, memory 50 undergoes the write operation and circuit 55 causes the column select signals to turn on the write gating transistors of column gating circuit 56 that are connected to the selected columns of memory array 51.

In accordance with one embodiment of the present invention, read/write select and write select hold circuit 55 delays turning off the write gating transistors of column gating circuit 56 that are connected to the selected columns of memory array 51 during a write operation such that address hold time of the write operation can be internally extended without delaying turning on the write gating transistors of column gating circuit 56 that are connected to the selected columns at the start of the write operation and without affecting or delaying another memory operation that follows the write operation. By delaying turning off the write gating transistors of column gating circuit 56 from the time when the address of the write operation ceases to be applied to column decoder 54 until the time when the WRITE signal is deasserted, sufficient time is given to recover the data along the selected columns such that other memory cells in memory array 51 will not be accidentally written with the data during another memory operation that follows the write operation. Because the delay only extends from the time when the column address ceases to be applied to column decoder 54 until the time the WRITE signal is deasserted during the write operation, the memory operation that follows the write operation is not affected by the delay.

In addition, because circuit 55 only delays turning off the write gating transistors of circuit 56 that are connected to the selected columns of memory array 51, no delay is therefore imposed on turning on those write gating transistors. Therefore, the start of the write operation is not affected or delayed. Moreover, by only delaying switching off the write gate transistors of column gating circuit 56 that are connected to the selected columns of memory array 51, the read operation of memory 50 is not affected at all by the delay. Therefore, by providing read/write select and write select hold circuit 55, sufficient time can be given to allow the selected columns of memory array 51 to recover the data applied during a write operation without (1) delaying the start of the write operation, (2) delaying the start of another operation that follows the write operation, (3) extending the address hold time of the address applied, and (4) affecting the read operation of the memory. Circuit 55 and its function will be described in more detail below, in conjunction with FIGS. 6–9.

FIG. 6 shows the block diagram of column decoding circuit 53. Column decoder 54 of column decoding circuit 53 includes a number of decoders, each receiving two bits of the column address to select one of four outputs of the decoder. FIG. 6 only shows one such decoder 61 of column decoder 54 in order not to obscure the description of the invention. As can be seen from FIG. 6, decoder 61 has four outputs Y0-SEL through Y3-SEL. Decoder 61 asserts one of the outputs Y0-SEL through Y3-SEL to select one column of memory array 51 for every column address applied. Each of the outputs of column decoder 54 is used for applying a select signal to circuit 55 for selecting its respective column of memory array 51.

Read/write select and write select hold circuit 55 includes a number of select path circuits, each connected to one of the number of outputs of decoder 54. In FIG. 6, only four select path circuits 62a through 62d are shown for illustration purposes. As can be seen from FIG. 6, each of circuits 62a–62d is connected to one of the outputs Y0-SEL through Y3-SEL of decoder 61 of column decoder 54. As also can be seen from FIG. 6, each of circuits 62a–62d has identical circuit structure and FIG. 8 shows the circuit of a select path circuit 90 that can be any one of the number of select path circuits of circuit 55, including select path circuits 62a–62d. The circuit shown in FIG. 8 will be described in more detail below.

Read/write select and write select hold circuit 55 also includes a number of paired NAND and AND gates, each pair being connected to one of the select path circuits of circuit 55. For example, NAND gate 64a and AND 64b are connected to select path circuit 62a and NAND gate 64g and AND 64h are connected to select path circuit 62d. FIG. 6 only shows NAND gates and AND gates 64a through 64h.

As can be seen from FIG. 6, the READ signal is applied to NAND gates 64a, 64c, 64e, and 64g to control these NAND gates to generate read select signals for their respective columns. For example, NAND gate 64a generates a Y0-READ read select signal that, when asserted, causes a column 0 (not shown) of memory array 51 to be selected for a read operation and NAND gate 64g generates a Y3-READ read select signal that, when asserted, causes a column 3 (not shown) of memory array 51 to be selected for a read operation.

Likewise, the WRITE signal is applied to AND gates 64b, 64d, 64f, and 64h to control these AND gates to generate write select signals for their respective columns. For example, AND gate 64b generates a Y0-WRITE write select signal that, when asserted, causes the column 0 of memory array 51 to be selected for a write operation and AND gate 64f generates a Y2-WRITE write select signal that, when asserted, causes a column 2 (not shown) of memory array 51 to be selected for a write operation.

As can be seen from FIG. 6, each of select path circuits 62a–62d includes a delay circuit and a multiplexer. For example, select path circuit 62a includes a delay circuit 70a and a multiplexer 73a. Delay circuit 70a is connected between multiplexer 73a and an input of circuit 62a. The other input of multiplexer 73a is directly connected to the input of select path circuit 62a via line 71a. Multiplexer 73a also includes a select input S that receives a D_WRITE signal from a resettable delay circuit 63. The output of multiplexer 73a is then applied to AND gate 64b. In addition, the input of select path circuit 62a is directly connected to NAND gate 64a via line 72a.

Delay circuit 70a can be implemented by any known delay circuit. For example, delay circuit 70a can include a number of serially connected inverters. As a further example, delay circuit 70a can be a programmable delay line circuit.

During operation, for example, when decoder 61 decodes address bits A0 and A1 to assert the Y0-SEL signal, the asserted Y0-SEL signal is then applied to select path circuit 62a. If memory 50 of FIG. 5 undergoes the read operation, the READ signal is asserted and the WRITE signal is deasserted. This causes all of AND gates 64b, 64d, 64f, and 64h to be blocked from asserting their respective outputs. In addition, each of NAND gates 64a, 64c, 64e, and 64g is enabled by the READ signal. Connection line 72a of select path circuit 62a then applies the Y0-SEL signal to NAND gate 64a and NAND gate 64a then asserts the Y0-READ signal.

When memory 50 undergoes the write operation, the READ signal is deasserted, which blocks NAND gates 64a, 64c, 64e, and 64g from asserting their respective outputs. The WRITE signal is asserted, which enables AND gates 64b, 64d, 64f, and 64h. Select path circuit 62a applies the asserted Y0-SEL signal to multiplexer 62a via connection line 71a and via delay circuit 70a. Whether the Y0-SEL signal or the delayed Y0-SEL signal passes through multiplexer 73a depends on the D_WRITE signal. The D_WRITE signal is a delayed signal of the WRITE signal. When the D_WRITE signal is not asserted, multiplexer 73a connects the Y0-SEL signal to AND gate 64b. When the D_WRITE signal is asserted, multiplexer 73a then connects the delayed Y0-SEL signal to AND gate 64b. This therefore extends the hold time of the Y0-SEL signal during the write operation without affecting or delaying the assertion of the Y0-SEL signal at AND gate 64b. In addition, the read operation is not affected because the Y0-SEL signal is directly applied to NAND gate 64a. Moreover, because delay circuit 63 is a resettable circuit that deasserts the D_WRITE signal as soon as the WRITE signal is deasserted, this does not extend the memory operation and therefore does not affect any memory operation that follows the write operation.

In order to ensure the delayed Y0-SEL signal from delay circuit 70a to be asserted when the D_WRITE signal is asserted, the delay time of resettable delay circuit 63 is set to be longer than that of delay circuit 70a, in one embodiment. This prevents the output of multiplexer 73a from being erroneously deasserted when multiplexer 73a switches to connect the delayed Y0-SEL signal from delay circuit 70a to the output of multiplexer 73a.

FIG. 7 shows the circuit of resettable delay circuit 63 of FIG. 6. As can be seen from FIG. 7, when the WRITE signal is asserted, the D_WRITE signal will be asserted at the end of the total delay of inverters 81 through 86 and NAND gates 87 and 88. When the WRITE signal is deasserted, the whole circuit will be quickly reset by the deasserted WRITE signal and the D_WRITE signal will be deasserted at the end of the total delay of only inverters 84–86 and NAND gate 88. This allows circuit 63 to be quickly reset. It shall be noted, however, that resettable delay circuit 63 can be implemented by other known circuits. For example, resettable delay circuit 63 can be implemented by a reprogrammable and resettable delay line circuit.

Referring to FIG. 8, the circuit of select path circuit 90 is shown that can be any one of the select path circuits of circuit 55 of FIG. 6. Select path circuit 90 includes delay circuit 91 and multiplexer 92. Select path circuit 90 receives a Y-SEL signal and outputs the Y-SEL signal and a D-Y-SEL signal. Multiplexer 92 outputs the D-Y-SEL signal. Multiplexer 92 selectively connects the Y-SEL signal and a delayed Y-SEL signal to its output to generate the D-Y-SEL signal under control of the D_WRITE signal and its complementary signal $\overline{\text{D\_WRITE}}$ from resettable delay circuit 63. The D-Y-SEL signal is then applied to a respective AND gate 97 to generate a write select Y-WRITE signal. And gate 97 can be any one of AND gates 64b, 64d, 64f, and 64h of FIG. 6. The generation of the Y-WRITE signal is controlled by the WRITE signal. The Y-SEL signal is also applied to a respective NAND gate 96 to generate a read select $\overline{\text{Y-READ}}$ signal. The generation of the $\overline{\text{Y-READ}}$ signal is controlled by the READ signal. NAND gate 96 can be any one of NAND gates 64a, 64c, 64f, and 64g of FIG. 6.

Figure 9:
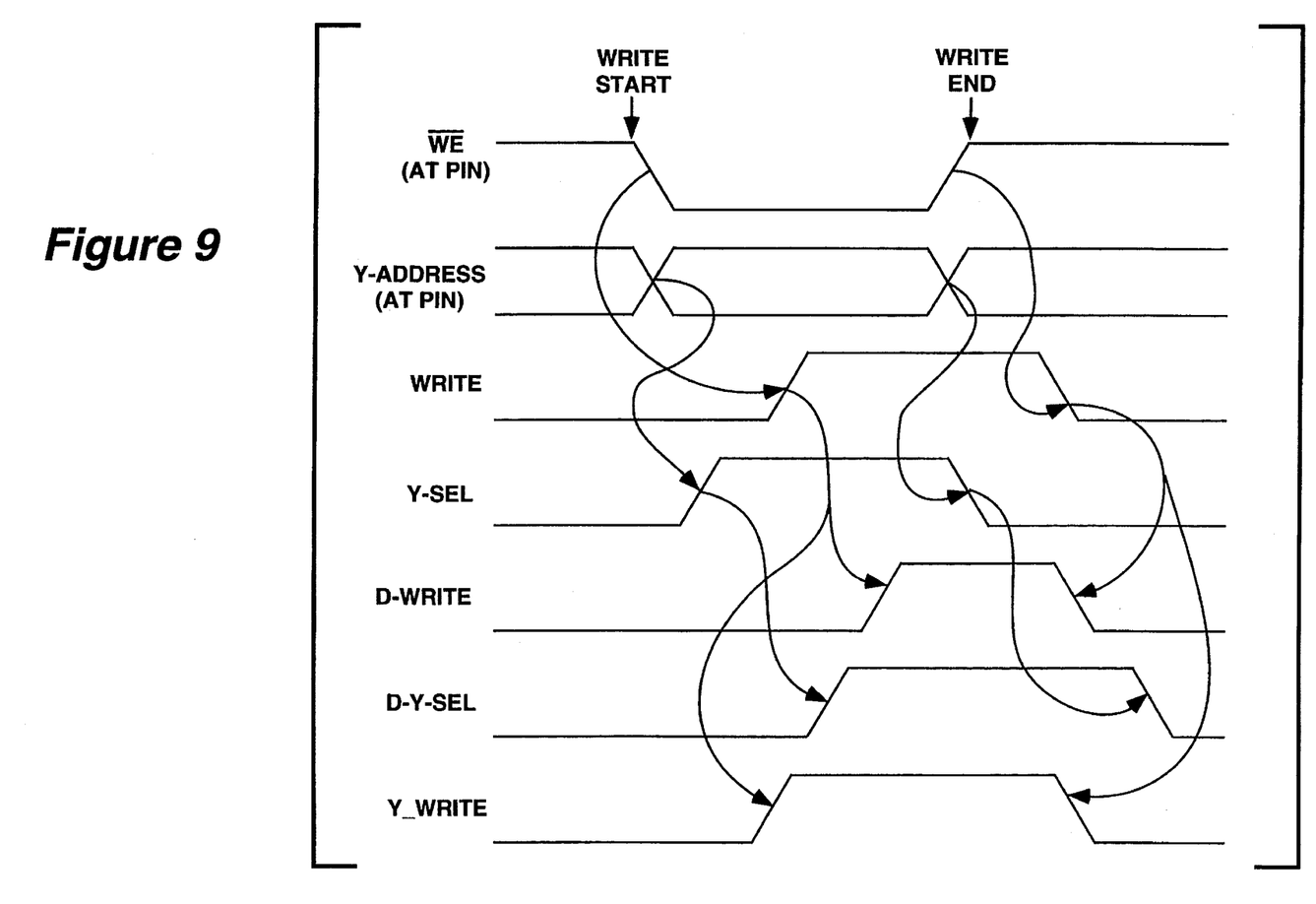
FIG. 9 shows various signal waveforms with respect to the decoding circuit of FIGS. 5–8.

As can be seen from FIG. 8, multiplexer 92 includes two transmission gates 93 and 94, each being connected to receive the Y-SEL signal and the delayed Y-SEL signal from delay circuit 91. Transmission gates 93 and 94 are alternately turned on to pass one of the Y-SEL signal and the delayed Y-SEL signal to become the D-Y-SEL signal. This causes the D-Y-SEL signal to be extended. FIG. 9 shows the signal wave forms of the relevant signals.

As can be seen from FIG. 9, the D-Y-SEL signal is extended. This also causes the Y-WRITE signal to be extended. This Y-WRITE signal now becomes deasserted only when the WRITE signal is deasserted. As can be seen from FIG. 9, the write address ceases to be applied before the WRITE signal is deasserted. The extended hold time for the Y-WRITE signal allows the selected column to recover the write data from the write operation such that the write data will not be left along the selected column. In addition, because the write operation still ends as the WRITE signal is deasserted, the extended hold time of the Y-WRITE signal does not affect any memory operation that follows the write operation. As also can be seen from FIG. 9, the start of the write operation is also not affected by the extended hold time of the D-Y-SEL signal. This is because the start of the D-Y-SEL signal is not delayed.

Referring back to FIG. 8, delay circuit 91 includes a number of inverters 91a through 91f, each having a predetermined delay time. As described above, delay circuit 91 can be implemented by other known delay circuits. For example, a delay line circuit or a programmable delay line circuit can be used for delay circuit 91. When a programmable delay line circuit is used in delay circuit 91, the delay time of delay circuit 91 can be programmed and reprogrammed.

Because the Y-SEL signal is directly applied to NAND gate 96 to generate the read select signal $\overline{\text{Y-READ}}$, select path circuit 90 does not extend the hold time of the Y-READ signal or delay the signal. This therefore causes the read operation not to be affected at all.

Figure 10:
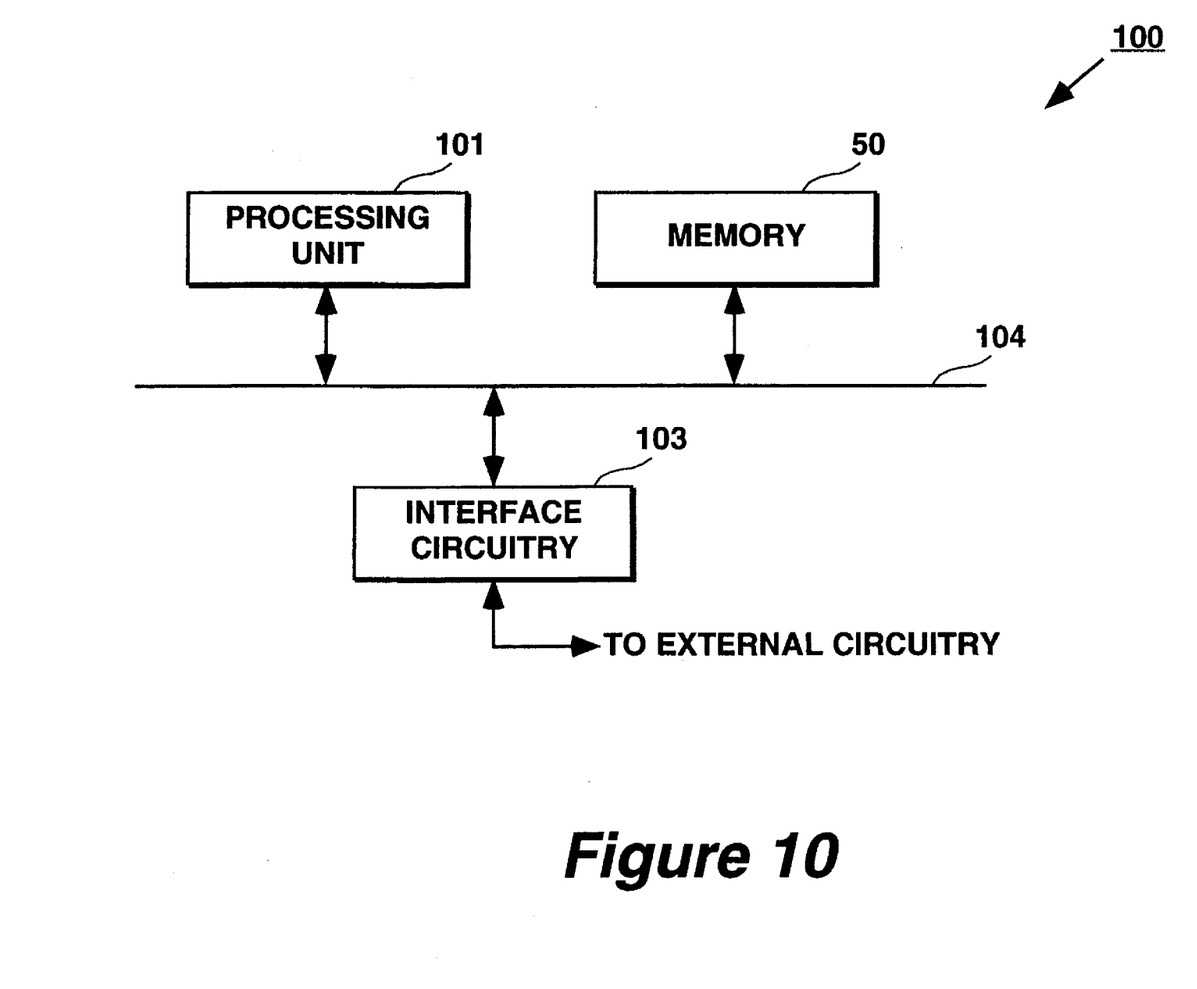
FIG. 10 is a block diagram of a data processing system that employs the memory of FIG. 5.

FIG. 10 shows in block diagram form a data processing system 100 that includes memory 50 of FIGS. 5–8. Data processing system 100, for one embodiment, is a personal computer system. Alternatively, data processing system 100 can be a laptop computer, a notebook computer, a mainframe computer, a multiprocessor computer, a workstation, a minicomputer, or any other type of computer system. In addition, data processing system 100 can be any other type of data processing system or signal processing system. For example, data processing system 100 can be a printer system, a cellular phone system, a display system, a digital camera system, or any other system that requires data storage.

As can be seen from FIG. 10, data processing system 100 includes a processing unit 101 in addition to memory 50. Processing unit 101 is used for processing data stored in memory 50. In addition, data processing system 100 includes interface circuit 103 for interfacing data processing system 100 with external circuitry (not shown in FIG. 10). Processing unit 101, memory 50, and interface circuitry 103 are all connected to a bus 104. FIG. 10 only shows processing unit 101, memory 50, and interface circuitry 103. In practice, data processing system 100 may include many other circuits.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A decoding circuit, comprising:

(A) a decoder coupled to receive an address for decoding the address to generate a select signal for selecting a memory location in a memory array for a memory operation;

(B) circuitry coupled to the decoder for delaying the select signal for a first predetermined delay time to generate a delayed select signal and for selectively applying one of the select signal and the delayed select signal to the memory array, wherein the circuitry applies the delayed select signal to the memory array during the memory operation before the select signal is to be deasserted such that duration of the asserted select signal is lengthened while address hold time of the memory operation is decreased.

2. The decoding circuit of claim 1, wherein the circuitry further comprises (a) a delay circuit coupled to the decoder for delaying the select signal to generate the delayed select signal;

(b) a select circuit coupled to the delay circuit and the decoder for selecting one of the select signal and the delayed select signal to be applied to the memory array, wherein the select circuit receives the select signal from the decoder and the delayed select signal from the delay circuit;

(c) a circuit coupled to the select circuit for delaying assertion of a memory operation control signal for a second predetermined delay time without delaying deassertion of the memory operation control signal in order to select one of the select signal and the delayed select signal, wherein the circuit causes the select circuit to apply (1) the select signal to the memory array when the memory operation control signal is asserted and (2) the delayed select signal to the memory array when the delayed memory operation control signal is asserted.

3. The decoding circuit of claim 2, wherein the circuit further comprises a resettable delay circuit, wherein when the memory operation control signal is deasserted, the resettable delay circuit is reset and the delayed memory operation control signal is also deasserted.

4. The decoding circuit of claim 3, wherein the first predetermined delay time is shorter than the second predetermined delay time.

5. The decoding circuit of claim 2, wherein the select circuit further comprises a multiplexer and the delay circuit further comprises a plurality of delay elements.

6. The decoding circuit of claim 2, wherein the delay circuit further comprises a programmable delay line circuit such that the first predetermined delay time can be reprogrammed.

7. A memory, comprising:

(A) a memory array having a plurality of memory locations;

(B) a decoder coupled to receive an address for decoding the address to generate a select signal for selecting one of the plurality of memory locations for a memory operation;

(C) circuitry coupled to the decoder and the memory array for delaying the select signal for a first predetermined delay time to generate a delayed select signal and for selectively applying one of the select signal and the delayed select signal to the memory array, wherein the circuitry applies the delayed select signal to the memory array during the memory operation before the select signal is to be deasserted such that duration of the asserted select signal is lengthened while address hold time of the memory operation is decreased.

8. The memory of claim 7, wherein the memory is a random access memory and the memory operation is a write operation.

9. The memory of claim 8, wherein the circuitry further comprises (a) a delay circuit coupled to the decoder for delaying the select signal to generate the delayed select signal;

(b) a select circuit coupled to the delay circuit and the decoder for selecting one of the select signal and the delayed select signal to be applied to the memory array, wherein the select circuit receives the select signal from the decoder and the delayed select signal from the delay circuit;

(c) a resettable delay circuit coupled to the select circuit for delaying assertion of a write enable signal for a second predetermined delay time without delaying deassertion of the write enable signal in order to select one of the select signal and the delayed select signal, wherein the resettable delay circuit causes the select circuit to apply (1) the select signal to the memory array when the write enable signal is asserted and (2) the delayed select signal to the memory array when the delayed write enable signal is asserted, wherein when the write enable signal is deasserted, the resettable delay circuit is reset and the delayed write enable signal is also deasserted.

10. The memory of claim 9, wherein the delay circuit further comprises a programmable delay line circuit such that the first predetermined delay time can be reprogrammed, wherein the resettable delay circuit further comprises a resettable programmable delay line circuit such that the first predetermined delay time can be reprogrammed, wherein the first predetermined delay time is shorter than the second predetermined delay time.

11. The memory of claim 9, wherein the select circuit further comprises a multiplexer and the delay circuit further comprises a plurality of delay elements.

12. A data processing system, comprising:

(A) a processing unit;

(B) interface circuitry coupled to the processing unit for interfacing the processing unit with external circuitry;

(C) a memory coupled to the processing unit for storing data processed by the processing unit, wherein the memory further comprises (i) a memory array having a plurality of memory locations;

(ii) a decoder coupled to receive an address for decoding the address to generate a select signal for selecting one of a plurality of memory locations for a memory operation;

(iii) circuitry coupled to the decoder for delaying the select signal for a first predetermined delay time to generate a delayed select signal and for selectively applying one of the select signal and the delayed select signal to the memory array, wherein the circuitry applies the delayed select signal to the memory array during the memory operation before the select signal is to be deasserted such that duration of the asserted select signal is lengthened while decreasing the address hold time of the memory operation.

13. The data processing system of claim 12, wherein the memory is a random access memory and the memory operation is a write operation.

14. The data processing system of claim 13, wherein the circuitry further comprises (a) a delay circuit coupled to the decoder for delaying the select signal to generate the delayed select signal;

(b) a select circuit coupled to the delay circuit and the decoder for selecting one of the select signal and the delayed select signal to be applied to the memory array, wherein the select circuit receives the select signal from the decoder and the delayed select signal from the delay circuit;

(c) a resettable delay circuit coupled to the select circuit for delaying assertion of a write enable signal for a second predetermined delay time without delaying deassertion of the write enable signal in order to select one of the select signal and the delayed select signal, wherein the resettable delay circuit causes the select circuit to apply (1) the select signal to the memory array when the write enable signal is asserted and (2) the delayed select signal to the memory array when the delayed write enable signal is asserted, wherein when the write enable signal is deasserted, the resettable delay circuit is reset and the delayed write enable signal is also deasserted.

15. The data processing system of claim 14, wherein the delay circuit further comprises a programmable delay line circuit such that the first predetermined delay time can be reprogrammed, wherein the resettable delay circuit further comprises a resettable programmable delay line circuit such that the second predetermined delay time can be reprogrammed, wherein the first predetermined delay time is shorter than the second predetermined delay time.

16. The data processing system of claim 14, wherein the select circuit further comprises a multiplexer and the delay circuit further comprises a plurality of delay elements.

* * * * *